(12) United States Patent
Park et al.

(10) Patent No.: US 8,841,219 B2
(45) Date of Patent: Sep. 23, 2014

(54) LITHOGRAPHY PROCESSES UTILIZING EXTREME ULTRAVIOLET RAYS AND METHODS OF MANUFACTURING SEMICONDUCTOR DEVICES USING THE SAME

(75) Inventors: Jun Taek Park, Seoul (KR); Chang Moon Lim, Seoul (KR); Seok Kyun Kim, Guri-si (KR)

(73) Assignee: SK Hynix Inc., Gyeonggi-do (KR)

( * ) Notice: Subject to any disclaimer, the term of this patent is extended or adjusted under 35 U.S.C. 154(b) by 23 days.

(21) Appl. No.: 13/617,998

(22) Filed: Sep. 14, 2012

(65) Prior Publication Data
US 2013/0210234 A1     Aug. 15, 2013

(30) Foreign Application Priority Data
Feb. 13, 2012 (KR) .................... 10-2012-0014460

(51) Int. Cl.
*H01L 21/311*     (2006.01)
(52) U.S. Cl.
USPC .................................. 438/703; 430/5; 355/72
(58) Field of Classification Search
USPC ...................... 438/703, 694; 355/72; 430/5
See application file for complete search history.

(56) References Cited

U.S. PATENT DOCUMENTS

2008/0070353 A1*   3/2008   Verweij et al. ................ 438/170
2008/0153287 A1*   6/2008   Jeong ........................... 438/669

* cited by examiner

*Primary Examiner* — Reema Patel
(74) *Attorney, Agent, or Firm* — William Park & Associates Patent Ltd.

(57) ABSTRACT

Lithography processes are provided. The lithography process includes installing a reticle masking (REMA) part having a REMA open region in a lithography apparatus, loading a reticle including at least one reticle chip region in which circuit patterns are disposed into the lithography apparatus, and sequentially exposing a first wafer field, which includes a first chip region corresponding to the reticle chip region, and a second wafer field, which includes a second chip region corresponding to the reticle chip region, of a wafer to rays using the reticle and the REMA part to transfer images of the circuit patterns onto the wafer. An edge boundary of the REMA open region transferred on the first wafer field is located on a scribe lane region between the first and second chip regions while the first wafer field is exposed. Methods of manufacturing a semiconductor device using the lithography process are also provided.

20 Claims, 13 Drawing Sheets

LITHOGRAPHY PROCESSES UTILIZING EXTREME ULTRAVIOLET RAYS AND METHODS OF MANUFACTURING SEMICONDUCTOR DEVICES USING THE SAME

CROSS-REFERENCES TO RELATED APPLICATIONS

The present application claims priority under 35 U.S.C 119(a) to Korean Application No. 10-2012-0014460, filed on Feb. 13, 2012, in the Korean intellectual property Office, which is incorporated herein by reference in its entirety.

BACKGROUND

1. Technical Field

Embodiments of the present disclosure relate generally to lithography processes and a method of manufacturing semiconductor devices. Additionally, the embodiments relate to lithography processes utilizing extreme ultraviolet (EUV) rays and methods of manufacturing semiconductor devices using the same.

2. Related Art

As critical dimensions (CDs) and/or pitch sizes of patterns constituting integrated circuits of semiconductor devices become reduced, an extreme ultraviolet (EUV) ray has been considered for source lights which may be used to transfer pattern images of photo masks (e.g., photo reticles) onto wafers during lithography processes. The extreme ultraviolet (EUV) ray has a short wave length of about 13.6 nanometers (nm). Thus, a lithography apparatus using the extreme ultraviolet (EUV) ray may include a mirror optical system and may adopt mirror masks or mirror reticles to perform the lithography process. The mirror masks (or the mirror reticles) may include a mask substrate and mirror layer patterns and absorption layer patterns formed on the mask substrate. The mirror layer patterns and absorption layer patterns may be formed using layout data.

When the EUV lithography processes employing the mirror optical system are performed, the critical dimension (CD) uniformity of the patterns formed on the wafers may be degraded at the edges of field regions which are exposed by the mirror optical system. Specifically, the mirror mask may include at least one field region including image patterns which should be transferred onto a wafer and a black region surrounding the at least one field region. Ideally, the black region should not reflect the EUV rays even though a portion of the EUV rays are irradiated on the black region. Thus, the black region of the mirror mask may be coated with a light absorption layer. However, the light absorption layer may not completely absorb the EUV rays which are irradiated thereon. That is, the light absorption layer in the black region may actually reflect a small portion of the EUV rays. Therefore, the small portion of the EUV rays may be reflected from a surface of the black region to undesirably travel toward other field regions of the wafer, which have already been exposed or are not yet exposed. Accordingly, each of the field regions (particularly, edges of each of the field regions) on the wafer may be exposed at least twice to cause non-uniform CDs of the patterns formed on the wafer. This phenomenon may be referred to as a black border effect. The black border effect may cause degradation of the CD uniformity of the patterns.

SUMMARY

Embodiments may be directed to lithography processes utilizing extreme ultraviolet (EUV) rays and methods of manufacturing semiconductor devices using the same.

According to various embodiments, a lithography process includes installing a reticle masking (REMA) part having a REMA open region in a lithography apparatus, loading a reticle including at least one reticle chip region in which circuit patterns are disposed into the lithography apparatus, and sequentially exposing a first wafer field and a second wafer field of a wafer to rays using the reticle and the REMA part to transfer images of the circuit patterns onto the wafer. The first wafer field includes a first chip region corresponding to the reticle chip region, and the second wafer field includes a second chip region corresponding to the reticle chip region. An edge boundary of the REMA open region transferred on the first wafer field is located on a scribe lane region between the first and second chip regions while the first wafer field is exposed.

According to various embodiments, a lithography process includes installing a reticle masking (REMA) part having a REMA open region in a lithography apparatus, loading a reticle having at least one reticle chip region in which circuit patterns are disposed, a reticle scribe lane region surrounding the reticle chip region and a reticle edge region into the lithography apparatus, and sequentially exposing a first wafer field and a second wafer field of a wafer to rays using the reticle and the REMA part to transfer images of the circuit patterns onto the wafer. The first wafer field includes a first chip region corresponding to the reticle chip region, and the second wafer field includes a second chip region corresponding to the reticle chip region. An edge boundary of a first REMA open region transferred on the first wafer field is located on a scribe lane region substantially between the first and second chip regions while the first wafer field is exposed.

According to various embodiments, a method of manufacturing a semiconductor device includes sequentially forming a material layer and a resist layer on a wafer including first and second chip regions and a scribe lane region between the first and second chip regions, exposing the resist layer in the first chip region using a first exposure step with a reticle and a reticle masking (REMA) part having a REMA open region, exposing the resist layer in the second chip region using a second exposure step with the reticle and the REMA part after the first exposure step, developing the exposed resist layer to form resist patterns, and etching the material layer using the developed resist layer including the resist patterns as an etch mask. An edge boundary of the REMA open region transferred on the wafer is located on the scribe lane region between the first and second chip regions whenever the first and second exposure steps are performed.

According to various embodiments, a method of manufacturing a semiconductor device includes sequentially forming a material layer and a resist layer on a wafer including a first chip region and a second chip region, exposing the resist layer in the first chip region using a first exposure step with a reticle and a reticle masking (REMA) part having a REMA open region, exposing the resist layer in the second chip region using a second exposure step with the reticle and the REMA part after the first exposure step, developing the exposed resist layer to form resist patterns, and etching the material layer using the developed resist layer as an etch mask. An edge boundary of the REMA open region transferred on the wafer is located on a region between the first and second chip regions whenever the first and second exposure steps are performed.

BRIEF DESCRIPTION OF THE DRAWINGS

The above and other features and advantages of the disclosure will become more apparent in view of the attached drawings and accompanying detailed description.

DETAILED DESCRIPTION

Various embodiments provide methods of improving the critical dimension (CD) uniformity in chip fields defined on a wafer by adjusting a size and a position of a REMA open region of a REMA part that may be employed in a lithography apparatus.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concept.

It will also be understood that when an element is referred to as being "on," "above", "below," or "under" another element, it can be directly "on," "above", "below," or "under" the other element, respectively, or intervening elements may also be present. In addition, it will also be understood that when an element is referred to as being "between" two elements, it can be the only element between the two elements, or one or more intervening elements may also be present. Further, the term semiconductor device used herein may correspond to a dynamic random access memory (DRAM) device, a flash memory device, or a non memory device such as a logic device.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added FIG. 1 is an example of a critical dimension (CD) map illustrating CD variations caused by a black border effect.

Figure 1:
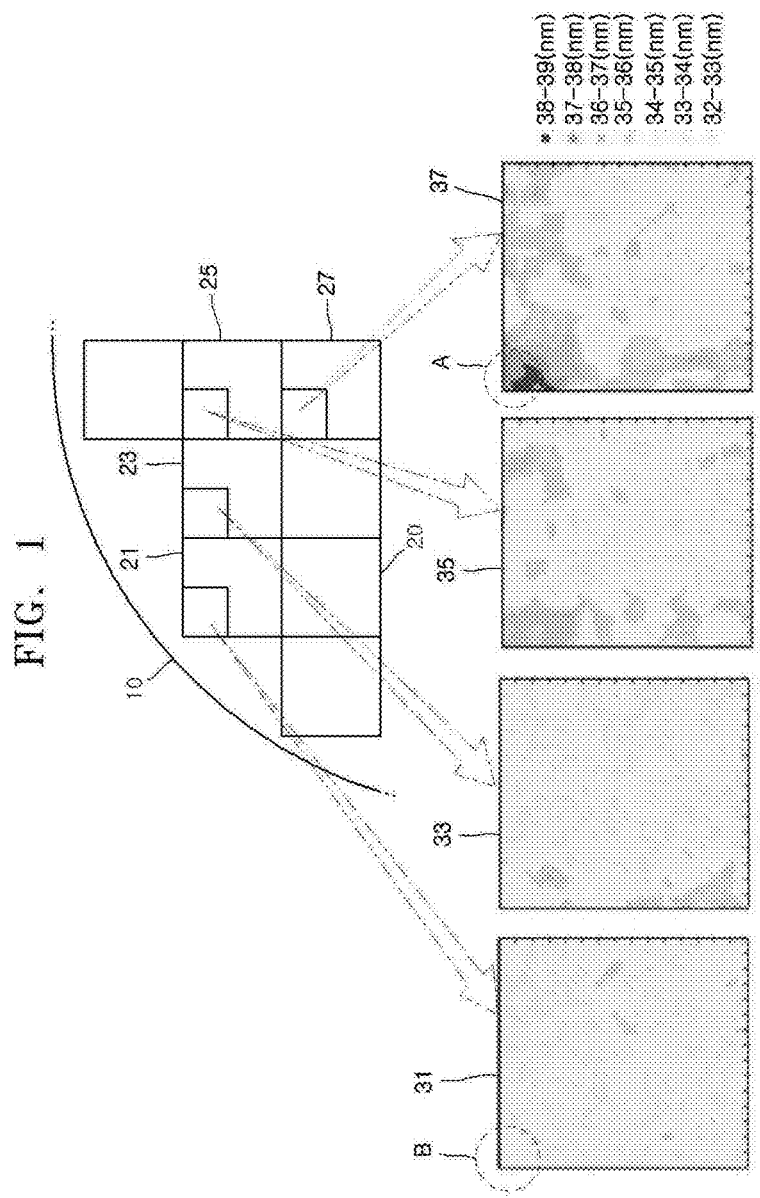
FIG. 1 is a CD map illustrating an example of CD variations caused by a black border effect.

Referring to FIG. 1, extreme ultraviolet (EUV) rays may be irradiated onto a reticle including image patterns, and the EUV rays may be reflected from a surface of the reticle toward a single field 20 of a wafer 10. As a result, the single field 20 may be exposed by the EUV rays which may be reflected from the reticle, and the image patterns of the reticle may be transferred onto the single field 20. The exposure step may be sequentially and repeatedly performed on the wafer 10 to expose a plurality of fields 20. The fields 20 may include a first field 21 substantially adjacent to an edge of the wafer 10, a second field 23 substantially adjacent to the first field 21 substantially opposite to the edge of the wafer 10, a third field 25 substantially adjacent to the second field 23 substantially opposite to the first field 21, and a fourth field 27 substantially adjacent to the third field 25 and close to a central region of the wafer 10. Accordingly, the numbers of the fields adjacent to the first, second, third and fourth fields 21, 23, 25, and 27, respectively, may be different from each other, as illustrated in FIG. 1. This may cause a difference between CD uniformities of the plurality of fields 20, for example, the first to fourth fields 21, 23, 25 and 27.

Specifically, a first CD map 31 measured in an upper left corner of the first field 21, a second CD map 33 measured in an upper left corner of the second field 23, a third CD map 35 measured in an upper left corner of the third field 25, and a fourth CD map 37 measured in an upper left corner of the fourth field 27 may be different from each other in terms of distribution of the pattern CD. That is, the CD variations of the second CD map 33 may be greater than the CD variations of the first CD map 31, and the CD variations of the third CD map 35 may be greater than the CD variations of the second CD map 33. Further, the CD variations of the fourth CD map 37 may be greater than the CD variations of the third CD map 35. This may be understood to mean that the CD variations increase when the number of the adjacent fields increases.

The upper left corner A of the fourth field 37 may be actually adjacent to three fields 20. In contrast, the upper left corner B of the first field 31 may not be adjacent to any fields. As a result, the CD variations of the fourth CD map 37 may be greater than the CD variations of the first CD map 31, as illustrated in FIG. 1. This may be understood to mean that whenever each of three fields adjacent to the corner A is exposed by an exposure step using EUV rays, a portion of the EUV rays are undesirably irradiated onto the corner A. That is, this may be due to a black border effect which relates to a multi-exposure phenomenon. Thus, the exposure energies introduced into the corners of the first to fourth CD maps 31, 33, 35, and 37 may be varied according to the number of adjacent fields thereof. Therefore, as mentioned above, the CD variations of the second CD map 33 may be greater than the CD variations of the first CD map 31, the CD variations of the third CD map 35 may be greater than the CD variations of the second CD map 33, and the CD variations of the fourth CD map 37 may be greater than the CD variations of the third CD map 35.

Figure 2:
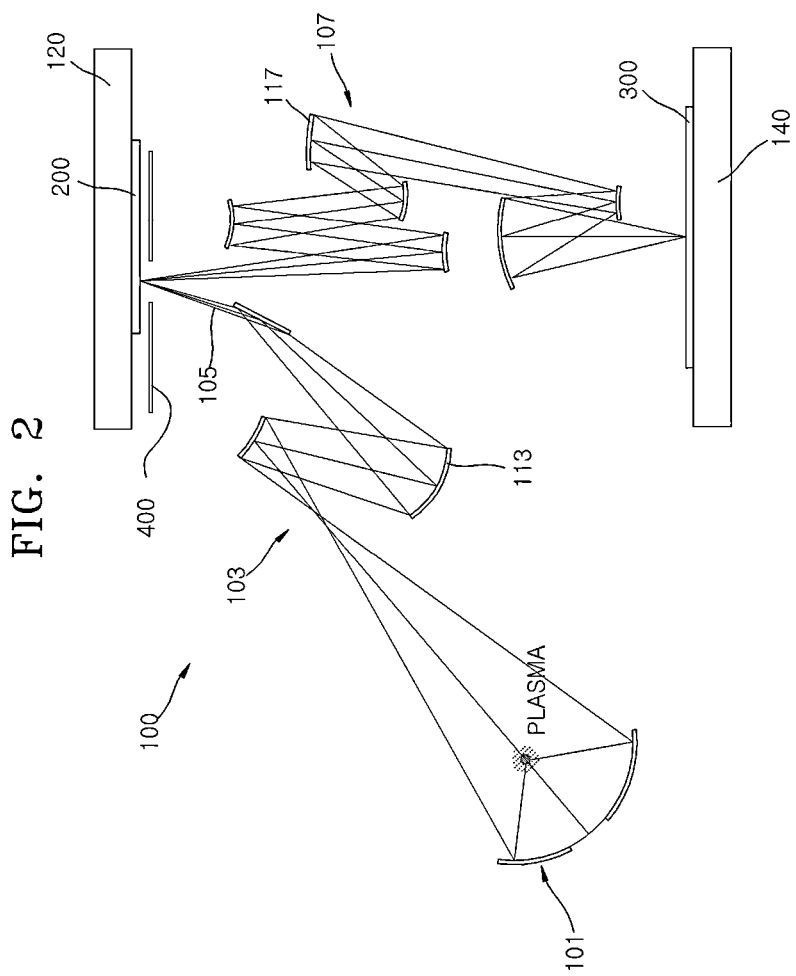
FIG. 2 is schematic view illustrating an example of a lithography apparatus employing an extreme ultraviolet (EUV) mirror optical system used in a lithography process according to various embodiments.

FIG. 2 is schematic view illustrating an example of a lithography apparatus employing an extreme ultraviolet (EUV) mirror optical system used in a lithography process according to various embodiments.

Referring to FIG. 2, a lithography process according to various embodiments may be performed using a lithography apparatus 100 that employs an EUV mirror optical system. The lithography apparatus 100 may be configured to include an EUV light source 101 generating EUV rays 105 with plasma, an illumination optical system 103 receiving the EUV rays 105 from the EUV light source 101 and irradiating the EUV rays 105 onto an EUV mirror reticle 200 loaded on a reticle stage 120, and a projection optical system 107 that transfers pattern images of the EUV mirror reticle 200 having a light reflection layer and a light absorption layer onto a wafer 300 loaded on a wafer stage 140 with the EUV rays 105 reflected from a surface of the EUV mirror reticle 200. The illumination optical system 103 may include a plurality of illumination mirrors 113 reflecting the EUV rays 105, and the projection optical system 107 may include a plurality of projection mirrors 117 that reduce or shrink the sizes of the pattern images of the EUV mirror reticle 200.

A reticle masking (REMA) part 400 may be disposed substantially between the EUV mirror reticle 200 and the illumination optical system 103. The REMA part 400 may provide a REMA open region, through which the EUV rays 105 from the illumination optical system 103 are irradiated onto the EUV mirror reticle 200. That is, the REMA part 400 may define an exposed region of the EUV mirror reticle 200 when the lithography apparatus 100 operates such that the EUV rays 105 from the illumination optical system 103 are irradiated onto the EUV mirror reticle 200. The REMA open region of the REMA part 400 may be adjusted to have an enough area to fully cover an actual area which may be required because of the limitation of the position accuracy of the REMA part 400.

Figure 3:
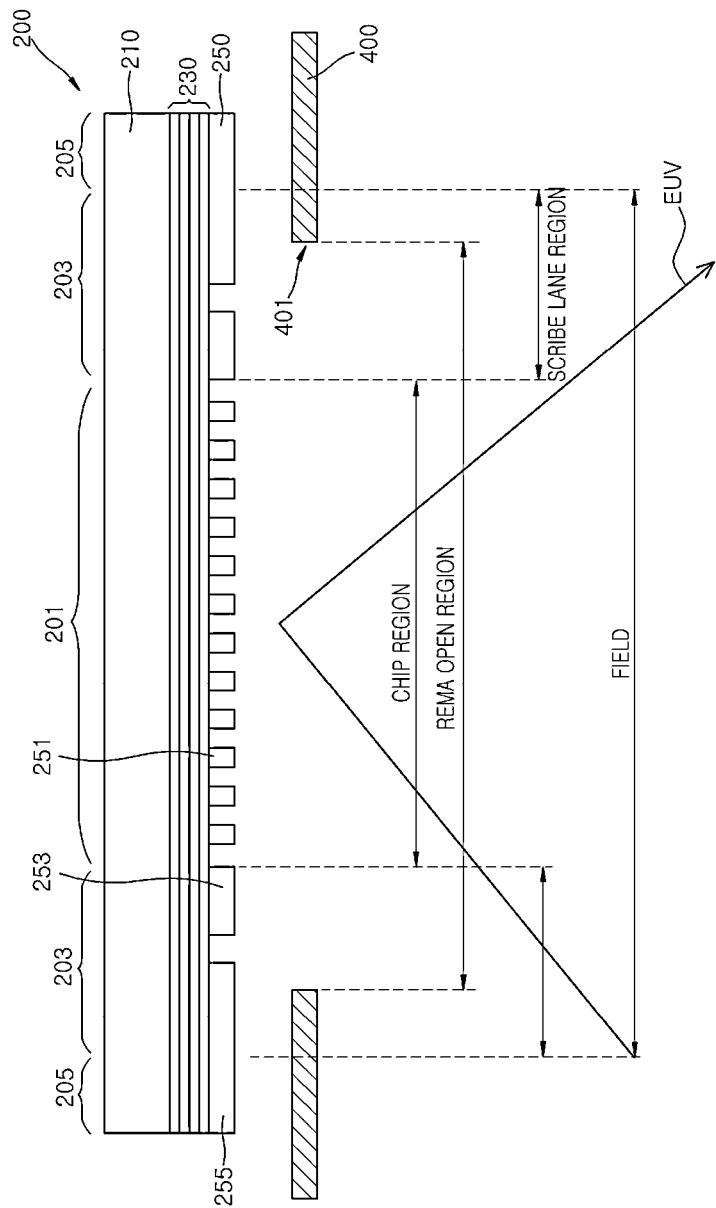
FIG. 3 is a cross sectional view illustrating an example of an extreme ultraviolet (EUV) mirror reticle and a reticle masking (REMA) part used in a lithography process according to various embodiments.

FIG. 3 is a cross sectional view illustrating an example of the extreme ultraviolet (EUV) mirror reticle and the reticle masking (REMA) part 400 shown in FIG. 2.

Referring to FIG. 3, the EUV mirror reticle 200 may include a light reflection layer 230 formed substantially on a substrate 210 to reflect the EUV rays and a light absorption layer 250 stacked substantially on portions of the light reflection layer 230 substantially opposite to the substrate 210. The light absorption layer 250 may have chip patterns 251 in a chip region 201 of the EUV mirror reticle 200, and the chip patterns 251 may correspond to layout patterns constituting integrated circuits. The images of the chip patterns 251 may be transferred onto the wafer 300. The light absorption layer 250 may further include scribe patterns 253 disposed substantially in a scribe lane region 203 of the EUV mirror reticle 200. The scribe patterns 253 may correspond to overlay keys. In addition, the light absorption layer 250 may still further include an edge pattern 255 disposed substantially in an edge region 205 of the EUV mirror reticle 200. The edge pattern 255 may substantially cover the light reflection layer 230 in the edge region 205 of the EUV mirror reticle 200 and may prevent the EUV rays irradiated onto the edge region 205 from being reflected.

The REMA part 400 may be formed of an opaque material blocking the EUV rays. For example, the REMA part 400 may be formed of an aluminum material. An area of the REMA open region of the REMA part 400 may be adjusted by varying the position of an opaque portion 401 of the REMA part 400. That is, an area of an image plane transferred on the wafer (300 of FIG. 2) may be adjusted by the area of the REMA open region of the REMA part 400.

The chip region 201 of the EUV mirror reticle 200 may be a region which may be substantially transferred on the wafer 300. Thus, the REMA open region of the REMA part 400 should be opened to expose at least the chip region 201 of the EUV mirror reticle 200. In addition, the REMA open region of the REMA part 400 may be opened to substantially expose the scribe lane region 203 of the EUV mirror reticle 200. The chip region 201 and the scribe lane region 203 may constitute a single exposure field, and the REMA part 400 may be adjusted such that a boundary line substantially between the opaque portion 401 and the REMA open region of the REMA part 400 may be located in the scribe lane region 203.

Figure 4:
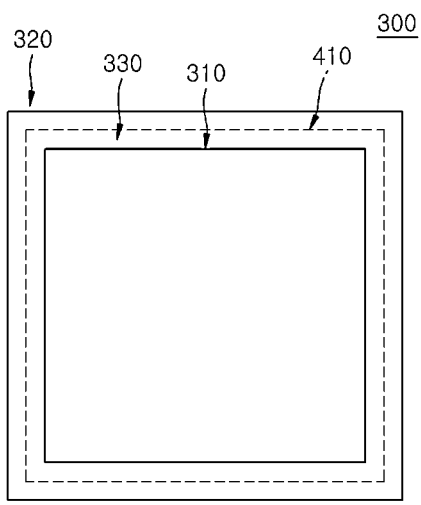
FIG. 4 is a plan view illustrating a position of a REMA open region in a wafer field defined by a lithography process according to various embodiments.

FIG. 4 is a plan view illustrating a position of a REMA open region in a wafer field defined by a lithography process according to various embodiments.

Referring to FIGS. 3 and 4, when the area of the REMA open region is adjusted by varying the position of the opaque portion 401 of the REMA part 400, the REMA open region of the REMA part 400 may be transferred onto an open region 410 in a field 320 of the wafer 300. That is, the REMA open region defined on the EUV mirror reticle (200 of FIG. 3) by the REMA part 400 may be transferred onto the REMA open region 410 of the wafer 300. Accordingly, the REMA open region 410 on the wafer 300 may be directly affected by the REMA open region of the REMA part 400.

Referring again to FIG. 4, a chip region 310 in the field 320 of the wafer 300 may correspond to the chip region 201 of the EUV mirror reticle 200. That is, the images of the chip patterns 251 in the chip region 201 of the EUV mirror reticle 200 may be transferred onto the chip region 310 in the field 320 of the wafer 300 through the REMA open region. While an exposure step may be performed to transfer the images of the chip patterns 251 of the EUV mirror reticle 200 onto the chip region 310 of the wafer 300, the REMA part 400 may be adjusted such that an edge boundary of the REMA open region 410 may be located in a scribe lane region 330 substantially surrounding the chip region 310 of the wafer 300. That is, the REMA part 400 may be adjusted such that the boundary line substantially between the opaque portion 401 and the REMA open region of the REMA part 400 may be located in the scribe lane region 203 of the EUV mirror reticle, as mentioned above.

Figure 5:
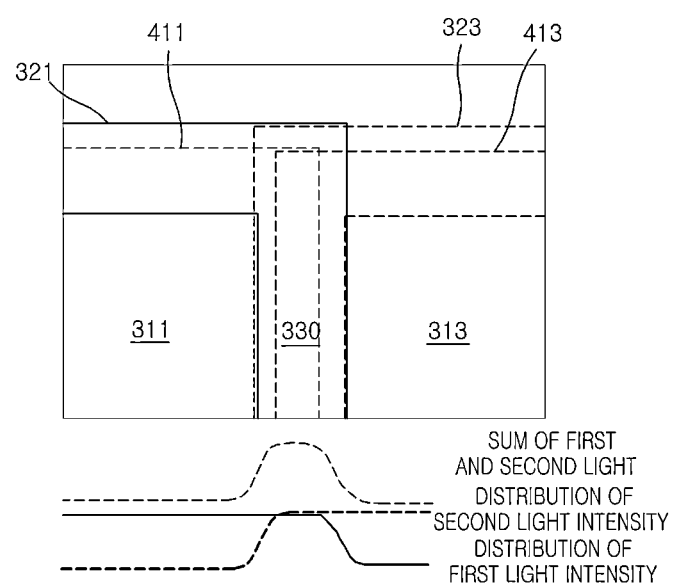
FIG. 5 is a plan view illustrating two adjacent REMA open regions defined by a lithography process according to various embodiments.
Figure 6:
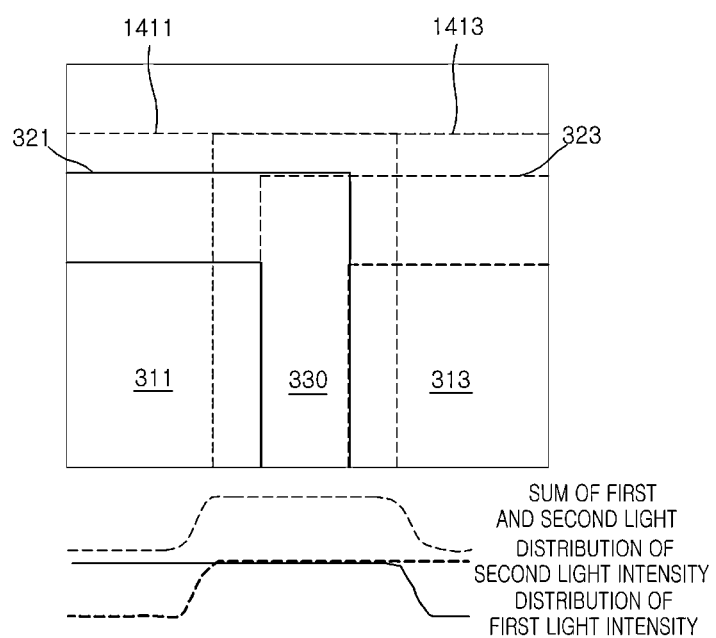
FIG. 6 is a plan view illustrating two adjacent REMA open regions defined by a lithography process to which a default REMA is applied.

FIG. 5 is a plan view illustrating two adjacent REMA open regions defined by a lithography process according to various embodiments, and FIG. 6 is a plan view illustrating two adjacent REMA open regions defined by a lithography process to which a default REMA condition may be applied.

Referring to FIG. 5, a first wafer field 321 may be substantially exposed using a first exposure step and a second wafer field 323 substantially adjacent to the first wafer field 321 may be substantially exposed using a second exposure step. When the first exposure step is performed to substantially expose the first wafer field 321, the REMA part 400 may be adjusted such that an edge boundary of a first REMA open region 411 may be located in a scribe lane region 330 substantially surrounding a first wafer chip region 311 of the first wafer field 321. In particular, the edge boundary of a first REMA open region 411 may be located in the scribe lane region 330 between the first wafer chip region 311 and a second wafer chip region 313 of the second wafer field 323.

After the first exposure step is performed, the second exposure step may be performed to substantially expose the second wafer field 323 adjacent to the first wafer field 321. When the second exposure step is performed to substantially expose the second wafer field 323, the REMA part 400 may be adjusted such that an edge boundary of a second REMA open region 413 may be located in the scribe lane region 330 substantially surrounding the second wafer chip region 313 of the second wafer field 323. In particular, the edge boundary of the second REMA open region 413 may be located in the scribe lane region 330 between the first and second wafer chip regions 311 and 313. The REMA part 400 may be adjusted such that a size of the first REMA open region 411 may be substantially equal to a size of the second REMA open region 413.

As described above, when the first and second exposure steps are performed, the edge boundaries of the first and second REMA open regions 411 and 413 may be located in the scribe lane 330 between the first and second wafer chip regions 311 and 313. Consequently, the black border effect relating to a double exposure phenomenon may be suppressed.

Referring again to FIG. 5, when the first exposure step is performed, a first light intensity may be normally uniform in the first REMA open region 411 and the first light intensity may be abruptly reduced at the edge of the first REMA open region 411. Similarly, when the second exposure step is performed, a second light intensity may be normally uniform in the second REMA open region 413 and the second light intensity may be abruptly reduced at the edge of the second REMA open region 413. Thus, a total light intensity of the first and second light intensities may be strong only in the scribe lane region 330 and no extra EUV rays may be irradiated onto the first and second wafer chip regions 311 and 313 during the first and second exposure steps.

According to the total light intensity illustrated in FIG. 5, the first and second wafer chip regions 311 and 313 including circuit patterns of an actual semiconductor device may not be over-exposed while the scribe lane region 330 may be over-exposed. This may lead to improvement of CD variations in edges of the first and second wafer chip regions 311 and 313.

In contrast, in the event that default values relating to the REMA open region of the REMA part 400 employed in the lithography apparatus (100 of FIG. 2) are applied, a first default REMA open region 1411 and a second default REMA open region 1413 may be enlarged. That is, an edge boundary of the first default REMA open region 1411 may be located substantially in the second wafer chip region 313 and an edge boundary of the second default REMA open region 1413 may be located substantially in the first wafer chip region 311, as illustrated in FIG. 6. Thus, when the first exposure step is performed to substantially expose the first wafer field 321, the EUV rays necessary for the first exposure step may be irradiated even onto an edge of the second wafer chip region 313 substantially adjacent to the first wafer chip region 311. Similarly, when the second exposure step is performed to substantially expose the second wafer field 323, the EUV rays necessary for the second exposure step may be irradiated even onto an edge of the first wafer chip region 311 substantially adjacent to the second wafer chip region 313.

As illustrated in FIG. 6, when the first exposure step is performed, a first light intensity may be normally uniform in the first wafer chip region 311 the first light intensity may also maintain even in the edge of the second wafer chip region 313 substantially adjacent to the first wafer chip region 311. Similarly, when the second exposure step is performed, a second light intensity may be normally uniform in the second wafer chip region 313 and the second light intensity may also maintain even in the edge of the first wafer chip region 311 substantially adjacent to the second wafer chip region 313. Thus, the edges of the first and second wafer chip regions 311 and 313 including the circuit patterns of an actual semiconductor device may be undesirably over-exposed. This may lead to degradation of CD variations in edges of the first and second wafer chip regions 311 and 313. That is, the default REMA values may result in the CD variations described with reference to FIG. 1.

As described with reference to FIGS. 5 and 6, when the sizes of the first and second REMA open regions 411 and 413 are adjusted such that the edge boundaries of the first and second REMA open regions 411 and 413 are located in the scribe lane 330 between the first and second wafer chip regions 311 and 313, the edges of the first and second wafer chip regions 311 and 313 may not be over-exposed to improve the CD variations in edges of the first and second wafer chip regions 311 and 313. These effects may be more clearly understood from the measurement results illustrated in FIGS. 7 and 8.

Figure 7:
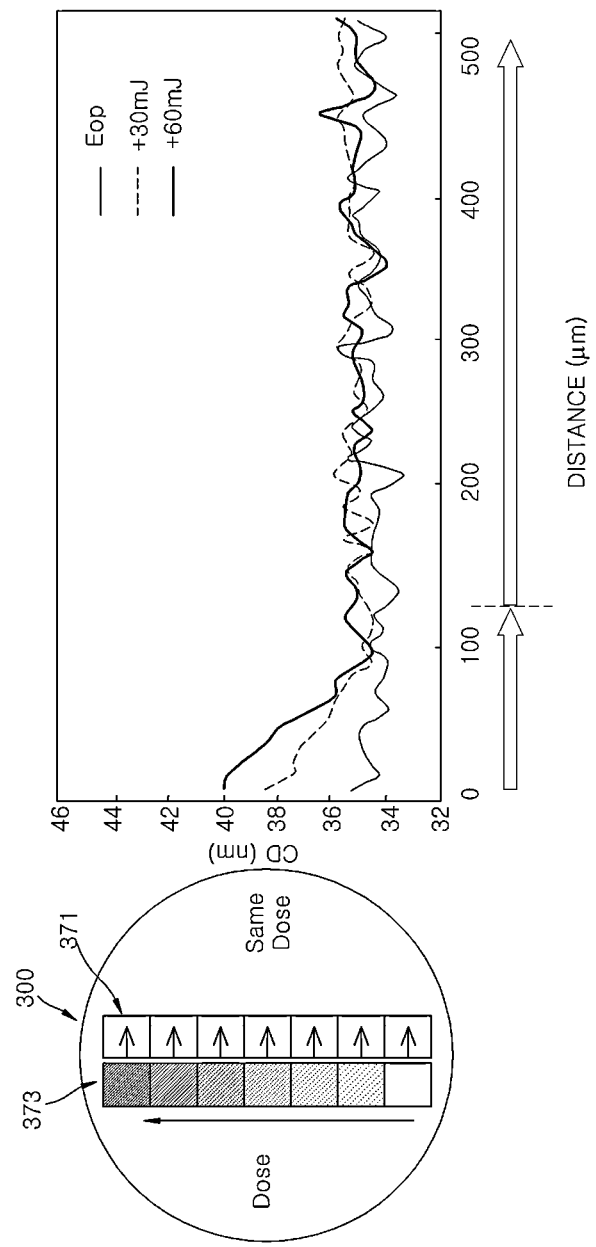
FIGS. 7 and 8 are critical dimension (CD) measurement results illustrating effects relative to various sizes and positions of a REMA open region by adjustment of a REMA part used in a lithography process according to various embodiments.
Figure 8:
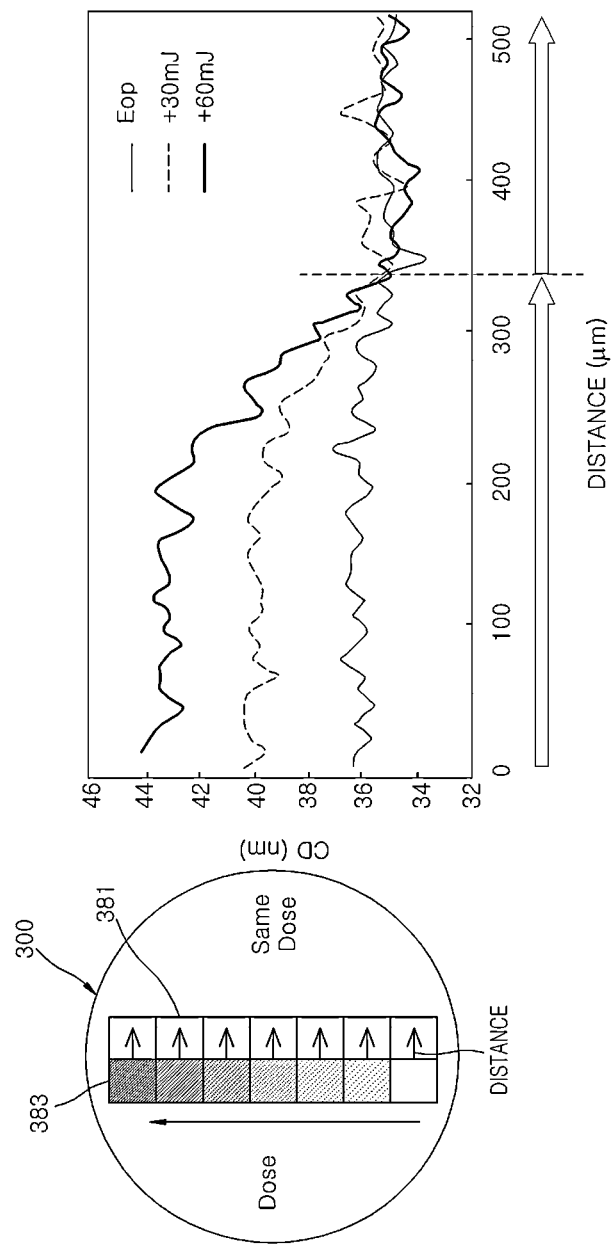

FIGS. 7 and 8 are critical dimension (CD) measurement results illustrating effects relative to various sizes and positions of a REMA open region by adjustment of a REMA part used in a lithography process according to various embodiments.

The lithography apparatus used to obtain the CD measurement results of FIGS. 7 and 8 was configured to include a light source generating extreme ultraviolet (EUV) rays having a wavelength of about 13.6 nanometers (nm) and a conventional 0.81 optical system having a numerical aperture (NA) of about 0.25. Further, the CD values of FIGS. 7 and 8 were obtained by measuring widths (e.g., diameters) of contact holes formed substantially on the wafer 300, and the contact holes were formed using the lithography apparatus. The contact holes were designed to have a width of about 30 nanometers on the layout. In FIGS. 7 and 8, the abscissa represents a distance from a left edge boundary of a right-sided chip region adjacent to a left-sided chip region toward an inner region of the right-sided chip region, and the ordinate represents a CD measurement value of the contact holes.

The contact holes illustrating the CD values of FIG. 7 were formed in each of fields 371 located at a right side in the wafer 300 using a first exposure step. The first exposure steps applied to all the right-sided fields 371 were performed with substantially the same dose of 18 mJ/cm$^2$. After the first exposure steps, second exposure steps were applied to fields 373 located at a left side in the wafer 300 and substantially adjacent to the fields 371. The second exposure steps applied to the left-sided fields 373 were performed with various doses of 18 mJ/cm$^2$ (denoted by an optimized dose 'Eop'), 30 mJ/cm$^2$ and 60 mJ/cm$^2$. Moreover, the first and second exposure steps applied to the fields 371 and 373 were performed using the substantially the same REMA condition as described with reference to FIG. 5. That is, during the first and second exposure steps applied to the fields 371 and 373, an edge boundary of the REMA open region was located in the scribe lane region and spaced apart from an edge of the adjacent wafer chip region by 250 micrometers.

The contact holes exhibiting the CD values of FIG. 8 were formed in each of fields 381 located at a right side in the wafer 300 using a first exposure step. The first exposure steps applied to all the right-sided fields 381 were performed with substantially the same dose of 18 mJ/cm$^2$. After the first exposure steps, second exposure steps were applied to fields 383 located at a left side in the wafer 300 and substantially adjacent to the fields 381. The second exposure steps applied to the left-sided fields 383 were performed with various doses of 18 mJ/cm$^2$ (denoted by an optimized dose 'Eop'), 30 mJ/cm$^2$ and 60 mJ/cm$^2$. Moreover, the first and second exposure steps applied to the fields 381 and 383 were performed using the default REMA condition as described with reference to FIG. 6. That is, during the first and second exposure steps applied to the fields 381 and 383, the REMA open region was expanded to substantially overlap with edge portions of the adjacent wafer chip regions by a width of about 80 micrometers.

As can be seen from the measurement values of FIG. 7, the CD values of the contact holes were substantially uniform throughout the chip regions of the right-sided fields 371 when the second exposure steps applied to the left-sided fields 373 were performed with the optimized dose Eop (e.g., 18 mJ/cm$^2$). When the dose of the second exposure steps was increased to be 30 mJ/cm$^2$ or 60 mJ/cm$^2$, the second exposure steps began to affect the CD uniformity of the contact holes formed in the edge region of the right-sided fields 371. That is, even though the dose of the second exposure steps was increased to be 30 mJ/cm$^2$ or 60 mJ/cm$^2$, the CD values of the contact holes were non-uniform only in the edge having a width of about 100 micrometers.

In contrast, when the first and second exposure steps were performed using the default REMA condition, the CD values of the contact holes in the right-sided fields 381 were non-uniform in the edge having a width of about 330 micrometers regardless of the doses of the second exposure steps applied to the left-sided fields 383. Accordingly, it can be understood that the black border effect may be suppressed when the REMA part is adjusted such that the edge boundary of the REMA open region is located in the scribe lane region substantially surrounding the exposed wafer chip region.

Referring again to FIGS. 7 and 8, it may be recognized that the default REMA open region applied to the fields 381 and 383 should be reduced by a width of about 330 micrometers per each side in order to suppress the black border effect.

Figure 9:
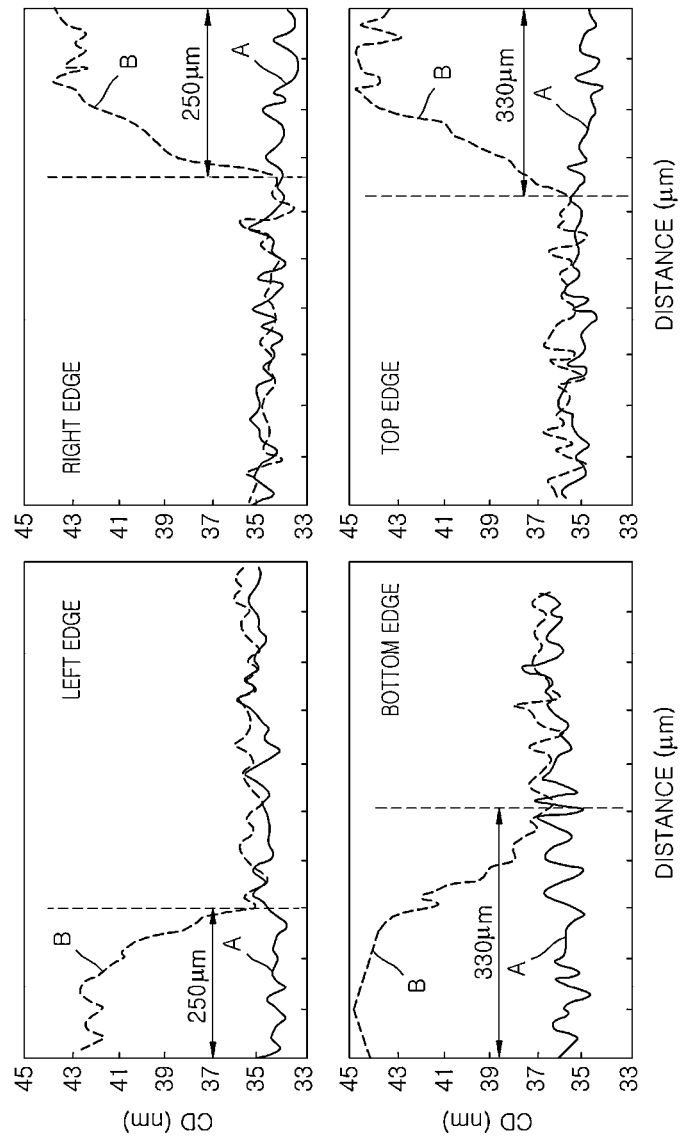
FIG. 9 illustrates critical dimension (CD) measurement results to describe a method of setting a size and a position of a REMA open region by adjustment of a REMA part used in a lithography process according to various embodiments.

FIG. 9 illustrates critical dimension (CD) measurement results for describing a method of setting a size and/or a position of a REMA open region by adjusting a REMA part used in a lithography process according to various embodiments.

FIG. 9 illustrates the CD measurement values of contact holes formed in four edges (e.g., a left edge, a right edge, a bottom edge and a top edge) of a central chip region (e.g., the chip region 310 of FIG. 4) in a central wafer field (e.g., the wafer field 320 of FIG. 4). In FIG. 9, data indicated by a reference character "A" correspond to CD values of the contact holes formed in the central chip region without any exposures of peripheral wafer fields surrounding the central chip region, and data indicated by a reference character "B" correspond to CD values of the contact holes formed in the central chip region together with exposures of the peripheral wafer fields substantially surrounding the central chip region. The central wafer field 320 and the peripheral wafer fields substantially surrounding the central wafer field 320 were substantially exposed using a REMA open region that has substantially the same size as each wafer field. That is, four edge boundaries of the REMA open region were consistent with four edge boundaries of each wafer field in a plan view. In other words, each of the wafer fields is composed of a single chip region and a scribe lane region substantially surrounding the single chip region.

As illustrated in FIG. 9, when only the central wafer field was substantially exposed without exposures of the peripheral wafer fields, the CD values of the contact holes formed in a central chip region of the central wafer field were substantially uniform throughout the central chip region in the central wafer field. However, when all of the central wafer field and the peripheral wafer fields were exposed with the REMA open region having substantially the same size as each wafer field, the CD values of the contact holes formed in four edges of the central chip region were influenced by the exposures of the peripheral wafer fields. Specifically, the exposures of the peripheral wafer fields influenced the left and right edges having a width of about 250 micrometers and the bottom and top edges having a width of about 330 micrometers in the central chip region. Thus, the size of the REMA open regions applied to the central wafer field and the peripheral wafer fields should be reduced by at least 250 micrometers per each side of the left and right sides and by at least 330 micrometers per each side of the top and bottom sides in order to suppress the black border effect to suppress and/or minimize the black border effect.

In general, each of the wafer fields and the central chip region has substantially a rectangular shape in a plan view. Accordingly, the REMA open region also has substantially a rectangular shape. That is, the REMA open region may be defined by a left edge boundary, a right edge boundary, a top edge boundary, and a bottom edge boundary.

From the data of FIG. 9, it can be understood that the size of the REMA open region should be optimized to suppress the black border effect. For example, when a first wafer field including a first chip region and a second wafer field including a second chip region are substantially adjacent to each other and a scribe lane is disposed between the first and second chip regions, a first REMA open region for exposing the first wafer field may be appropriately controlled to suppress the black border effect.

In various embodiments, when the first wafer field is exposed with the first REMA open region, the first REMA region may be located to be spaced apart from the second chip region by a predetermined distance in order to prevent EUV rays passing through the first REMA open region from being irradiated onto the second chip region. For example, when the first wafer field is exposed with the first REMA open region, an edge boundary of the first REMA open region may be located in the scribe lane between the first and second chip regions.

In various embodiments, when the first wafer field is exposed with the first REMA open region, the first REMA open region may be spaced apart from the second chip region by a distance of about 100 micrometers to about 350 micrometers.

In various embodiments, when the first wafer field is exposed with the first REMA open region, the first REMA open region may be spaced apart from the second chip region by a distance of about 250 micrometers to about 330 micrometers.

In various embodiments, the second chip region may be disposed substantially at a right side or a left side of the first chip region, and a third chip region may be further disposed substantially at a top side or a bottom side of the first chip region. In such a case, the first REMA open region for exposing the first wafer field may be spaced apart from the second chip region by a first distance and may be spaced apart from the third chip region by a second distance. The first distance may be less than the second distance. For example, the first distance may be within the range of about 200 micrometers to about 250 micrometers, and the second distance may be within the range of about 270 micrometers to about 330 micrometers.

Figure 10:
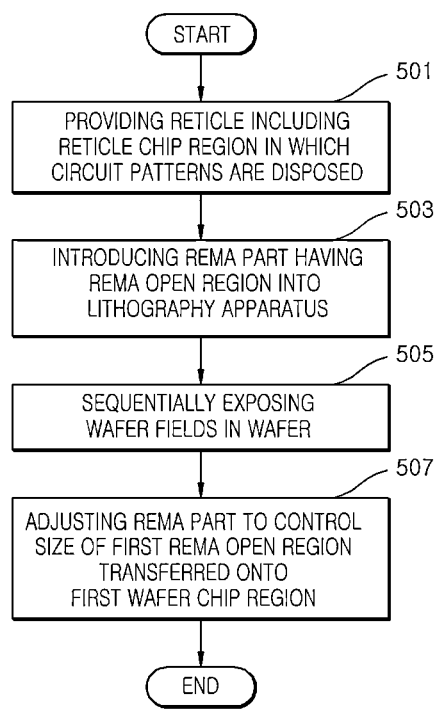
FIG. 10 is a flowchart illustrating a lithography process according to various embodiments.

FIG. 10 is a flowchart illustrating a lithography process according to various embodiments.

Referring to FIG. 10, a lithography process according to various embodiments may be performed by adjusting the REMA part 400 of the EUV lithography apparatus 100 illustrated in FIG. 2 to control the size of the REMA open region (411 or 413 of FIG. 5), as described with reference to FIGS. 4 and 5. Specifically, a reticle 200 may be provided (at step 501 of FIG. 10). The reticle 200 may include at least one reticle chip region (201 of FIG. 3) in which circuit patterns are disposed. Images of the circuit patterns may be transferred onto a wafer. A reticle masking (REMA) part (200 of FIG. 2) may be introduced into the EUV lithography apparatus (at step 503 of FIG. 10). The REMA part may have a REMA open region that provides an image plane and may be disposed to be adjacent to the reticle. A plurality of wafer fields in a wafer may be sequentially exposed using the EUV lithography apparatus with the REMA part, as described with reference to FIG. 5 (at step 505 of FIG. 10). A first wafer field (321 of FIG. 5) of the plurality of wafer fields may be exposed by a first exposure step. During the first exposure step, the REMA part 400 may be adjusted to control a size of a first REMA open region 411 (at step 507 of FIG. 10). That is, the REMA part 400 may be adjusted such that an edge boundary of a first REMA open region 411 may be transferred onto a scribe lane region 330. Similarly, a second wafer field (323 of FIG. 5) of the plurality of wafer fields may be exposed by a second exposure step, and the remaining wafer fields may also be exposed using the same manners.

The lithography process described above may be equally applicable to any other semiconductor devices, for example, DRAM devices or flash memory devices, etc.

FIGS. 11 to 14 are cross sectional views illustrating a method of manufacturing a semiconductor device using a lithography process according to various embodiments.

Figure 11:
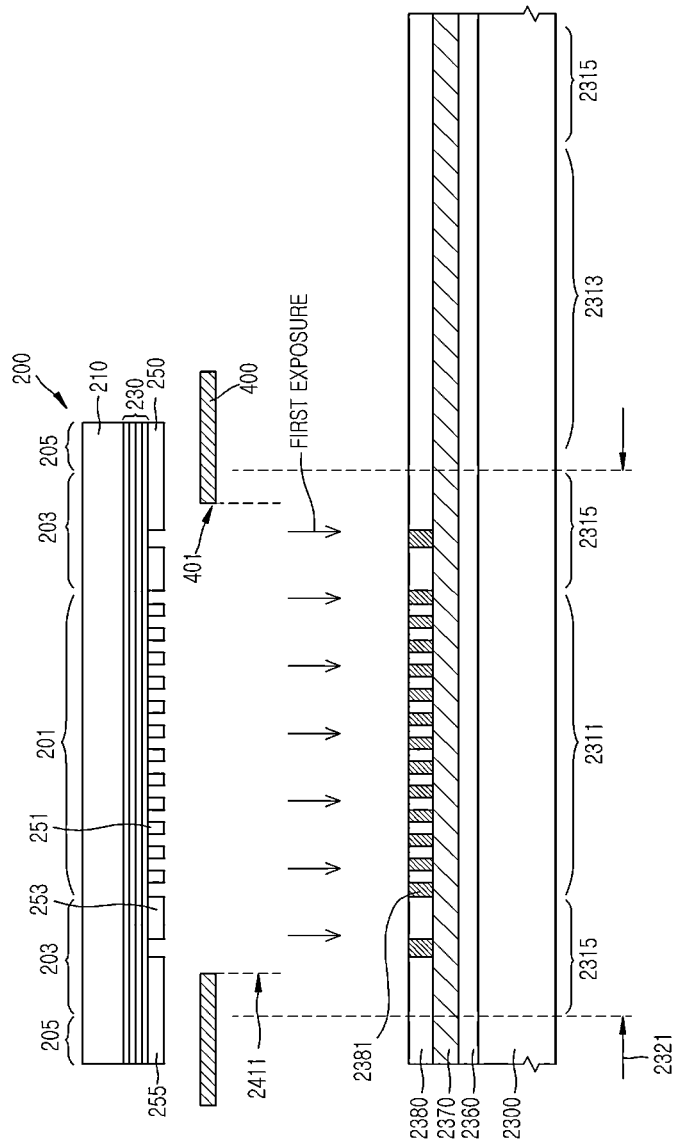
FIGS. 11 to 14 are cross sectional views illustrating a method of manufacturing a semiconductor device using a lithography process according to various embodiments.

Referring to FIG. 11, a bottom layer 2360, a top layer 2370, and a resist layer 2380 may be sequentially formed substantially on a semiconductor substrate 2300 such as a semiconductor wafer. The semiconductor wafer 2300 may include a plurality of chip regions, for example, a first chip region 2311, a second chip region 2313, and etc. Further, the semiconductor wafer 2300 may include a scribe lane region 2315 between the chip regions. A semiconductor device, for example, a DRAM device or a flash memory device may be formed in each of the chip regions 2311 and 2313. The semiconductor device may include a plurality of discrete elements such as transistors. The bottom layer 2360 may be an insulation layer acting as an interlayer insulation layer or a conductive layer acting as a gate of the transistors. The top layer 2370 may include a mold layer used as a sacrificial layer. Alternatively, the top layer 2370 may include a hard mask layer. That is, the top layer 2370 may be patterned to form hard mask patterns in a subsequent process. The hard mask patterns may be used as etch masks when the bottom layer 2360 is patterned. The resist layer 2370 may be patterned using a lithography process, thereby forming resist patterns. The resist patterns may be used as etch masks when the top layer 2370 is patterned.

The wafer 2300 including the resist layer 2380 may be loaded into the EUV lithography apparatus 100 illustrated in FIG. 2 and the chip regions 2311 and 2313 in the wafer 2300 may be sequentially exposed using the EUV lithography apparatus 100. Specifically, a first wafer field 2321 including the first chip region 2311 may be exposed using a first exposure step that utilizes the EUV mirror reticle 200 and the REMA part 400, as described with reference to FIG. 3. During the first exposure step, the REMA part 400 may be adjusted to have a first REMA open region 2411. That is, during the first exposure step, the REMA part 400 may be adjusted such that the first REMA open region 2411 substantially exposes an entire portion of the first chip region 2311 and a portion of the scribe lane region 2315 substantially surrounding the first chip region 2311. While the first exposure step is performed, images of the patterns 251 and 253 in the reticle 200 may be transferred onto the resist layer 2380, thereby forming first exposure regions 2381 in the resist layer 2380.

Figure 12:
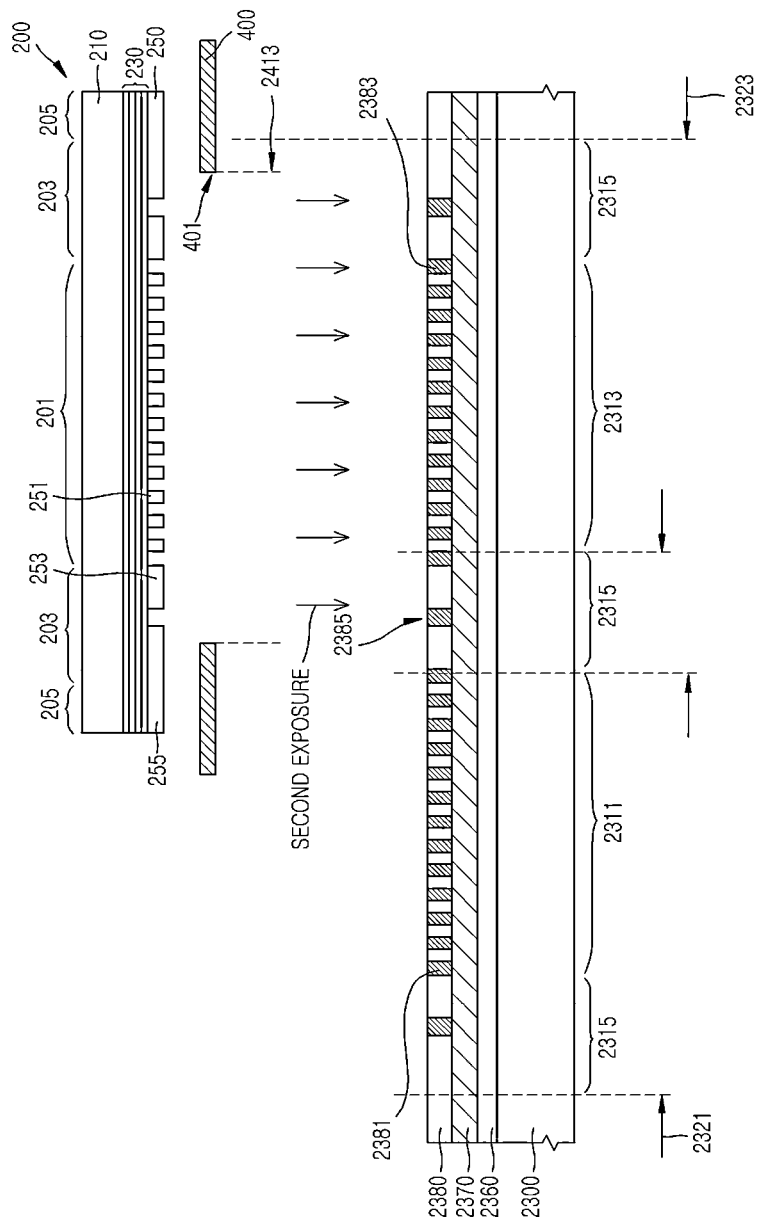

Referring to FIG. 12, after exposure of the first wafer field 2321, a second wafer field 2323 including the second chip region 2313 may be exposed using a second exposure step. During the second exposure step, the REMA part 400 may be adjusted to have a second REMA open region 2413. That is, during the second exposure step, the REMA part 400 may be adjusted such that the second REMA open region 2413 substantially exposes an entire portion of the second chip region 2313 and a portion of the scribe lane region 2315 substantially surrounding the second chip region 2313. While the second exposure step is performed, images of the patterns 251 and 253 in the reticle 200 may be transferred onto the resist layer 2380 in the second chip region 2313, thereby forming second exposure regions 2383 in the resist layer 2380. In addition, whenever the first and second exposure steps are performed, at least a portion of the resist layer 2380 in the scribe lane region 2315 may be substantially exposed. Thus, after the second exposure step is performed, a double exposure region 2385 may be formed in at least a portion of the resist layer 2380 in the scribe lane region 2315.

As described above, while the first and second exposure steps are performed, the REMA part 400 may be adjusted such that edge boundaries of the REMA open regions 2411 and 2413 are located in the scribe lane region 2315 between the first and second chip regions 2311 and 2313. The first wafer field 2321 may be defined to include the first chip region 2311, but not to overlap with the second chip region 2313. Similarly, the second wafer field 2323 may be defined to include the second chip region 2313, but not to overlap with the first chip region 2311.

Figure 13:
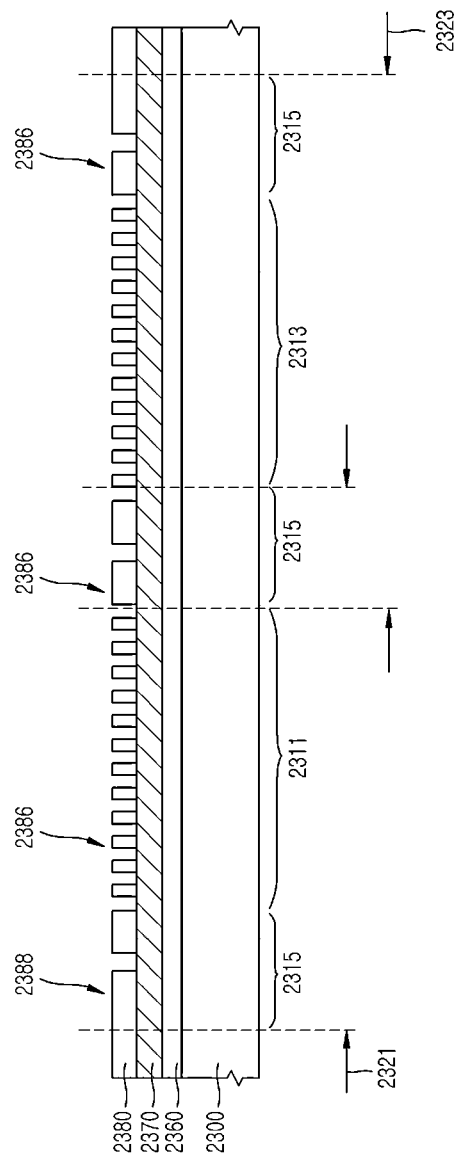

Referring to FIG. 13, after the first and second exposure steps, the exposed resist layer 2380 may be developed to form resist patterns 2386 and 2388 that correspond to the patterns 251 and 253 of the reticle 200. The resist patterns may include first resist patterns 2386 substantially formed in each of the chip regions 2311 and 2313 and second resist patterns 2388 formed in the scribe lane region 2315.

Figure 14:
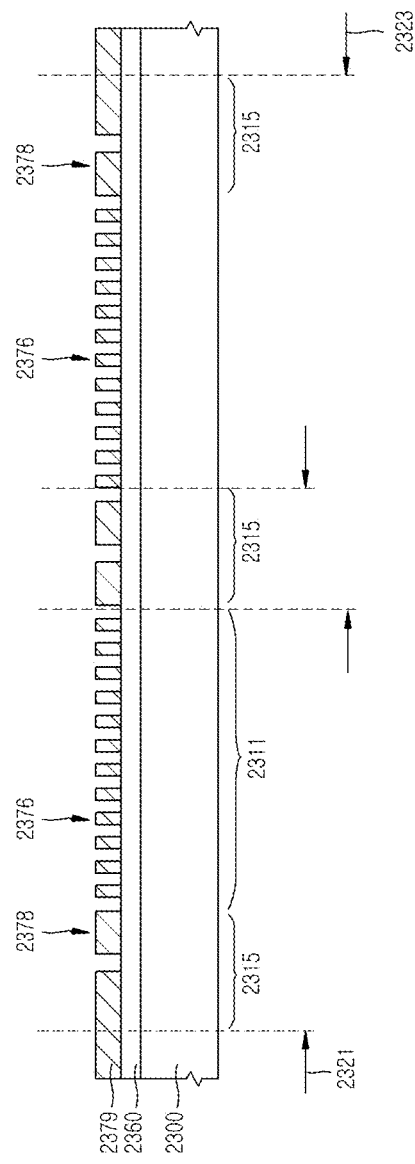

Referring to FIG. 14, the top layer 2370 may be etched using the developed resist layer (including the resist patterns 2386 and 2388) as etch masks, thereby forming top layer patterns 2379. The top layer patterns may 2379 may include chip patterns 2376 and scribe patterns 2378. The chip patterns 2376 may be patterns that define contact holes or interconnection lines (e.g., bit lines). Alternatively, the chip patterns 2376 may be mold patterns, sacrificial patterns, or hard mask patterns.

According to the embodiments set forth above, EUV lithography processes are provided. The EUV lithography processes may utilize a reticle masking (REMA) part having a REMA open region. The REMA open region for exposing a first wafer field including a first chip region may be adjusted not to overlap with a second chip region which may be adjacent to the first chip region. Thus, a back border effect may be minimized and/or suppressed.

The exemplary embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A lithography process comprising:
installing a reticle masking (REMA) part having a REMA open region in a lithography apparatus;
loading a reticle including at least one reticle chip region in which circuit patterns are disposed into the lithography apparatus; and sequentially exposing a first wafer field and a second wafer field of a wafer to rays using the reticle and the REMA part to transfer images of the circuit patterns onto the wafer, wherein the first wafer field includes a first chip region corresponding to the reticle chip region and the second wafer field includes a second chip region corresponding to the reticle chip region, and wherein an edge boundary of the REMA open region transferred on the first wafer field is located on a scribe lane region between the first and second chip regions while the first wafer field is exposed.

2. The lithography process of claim 1, wherein while the first wafer field is exposed, a size of the REMA open region is adjustable such that the edge boundary of the REMA open region transferred on the first wafer field is located on an edge boundary of the scribe lane region substantially adjacent to the first chip region or on an edge boundary of the scribe lane region substantially adjacent to the second chip region.

3. The lithography process of claim 1, wherein while the first wafer field is exposed, a size of the REMA open region is adjustable such that the REMA open region transferred on the first wafer field is spaced apart from the second chip region by a distance of about 100 micrometers to about 350 micrometers.

4. The lithography process of claim 3, wherein while the first wafer field is exposed, the size of the REMA open region is adjustable such that the REMA open region transferred on the first wafer field is spaced apart from the second chip region by a distance of about 250 micrometers to about 330 micrometers.

5. The lithography process of claim 3:
wherein the wafer further includes a third chip region disposed substantially at a top side or a bottom side of the first chip region;
wherein the second chip region is disposed substantially at a right side or a left side of the first chip region;
wherein the REMA open region for exposing the first wafer field is spaced apart from the second chip region by a first distance and is spaced apart from the third chip region by a second distance; and
wherein the first distance is less than the second distance.

6. The lithography process of claim 5, wherein the first distance is within the range of about 200 micrometers to about 250 micrometers, and the second distance is within the range of about 270 micrometers to about 330 micrometers.

7. The lithography process of claim 5, wherein the first distance is about 250 micrometers, and the second distance is about 330 micrometers.

8. The lithography process of claim 1, wherein the first wafer field and the second wafer field substantially overlap with each other in the scribe lane region between the first and second chip regions.

9. The lithography process of claim 1, wherein the reticle is an extreme ultraviolet (EUV) mirror reticle.

10. A lithography process comprising:
installing a reticle masking (REMA) part having a REMA open region in a lithography apparatus;
loading a reticle having at least one reticle chip region in which circuit patterns are disposed, a reticle scribe lane region surrounding the reticle chip region and a reticle edge region into the lithography apparatus; and
sequentially exposing a first wafer field and a second wafer field of a wafer to rays using the reticle and the REMA part to transfer images of the circuit patterns onto the wafer, wherein the first wafer field includes a first chip region corresponding to the reticle chip region and the second wafer field includes a second chip region corresponding to the reticle chip region, and wherein an edge boundary of a first REMA open region transferred on the first wafer field is located on a scribe lane region substantially between the first and second chip regions while the first wafer field is exposed.

11. The lithography process of claim 10, wherein the REMA part has an edge formed of an opaque material and the REMA open region of the REMA part is defined by the edge of the REMA part.

12. A method of manufacturing a semiconductor device, the method comprising:
sequentially forming a material layer and a resist layer on a wafer including first and second chip regions and a scribe lane region between the first and second chip regions;
exposing the resist layer in the first chip region using a first exposure step with a reticle and a reticle masking (REMA) part having a REMA open region;
exposing the resist layer in the second chip region using a second exposure step with the reticle and the REMA part after the first exposure step;
developing the exposed resist layer to form a resist patterns; and
etching the material layer using the developed resist layer including the resist patterns as an etch mask, wherein an edge boundary of the REMA open region transferred on the wafer is located on the scribe lane region between the first and second chip regions whenever the first and second exposure steps are performed.

13. The method of claim 12, wherein during the first exposure step, a size of the REMA open region is adjustable such that the edge boundary of the REMA open region transferred on the first chip region is located on an edge boundary of the scribe lane region substantially adjacent to the first chip region or on an edge boundary of the scribe lane region substantially adjacent to the second chip region.

14. The method of claim 12, wherein during the first exposure step, a size of the REMA open region is adjustable such that the REMA open region transferred on the first chip region is spaced apart from the second chip region by a distance of about 100 micrometers to about 350 micrometers.

15. The method of claim 14, wherein during the first exposure step, the size of the REMA open region is adjustable such that the REMA open region transferred on the first chip region is spaced apart from the second chip region by a distance of about 250 micrometers to about 330 micrometers.

16. The method of claim 12, wherein the resist layer in the scribe lane region is double exposed from the first and second exposure steps.

17. The method of claim 12, wherein the reticle is an extreme ultraviolet (EUV) mirror reticle.

18. A method of manufacturing a semiconductor device, the method comprising:
sequentially forming a material layer and a resist layer on a wafer including a first chip region and a second chip region;
exposing the resist layer in the first chip region using a first exposure step with a reticle and a reticle masking (REMA) part having a REMA open region;
exposing the resist layer in the second chip region using a second exposure step with the reticle and the REMA part after the first exposure step;
developing the exposed resist layer to form resist patterns; and etching the material layer using the developed resist layer as an etch mask,
wherein an edge boundary of the REMA open region transferred on the wafer is located on a region between the first and second chip regions whenever the first and second exposure steps are performed.

19. The method of claim 18, wherein the reticle is an extreme ultraviolet (EUV) mirror reticle.

20. The method of claim 18, further comprising:
adjusting a size of the REMA open region.

* * * * *